United States Patent [19]
Beckenbach et al.

[11] Patent Number: 4,639,686
[45] Date of Patent: Jan. 27, 1987

[54] HIGH FREQUENCY AMPLIFIER CIRCUIT

[75] Inventors: Walter Beckenbach; Heinz Rinderle, both of Heilbronn, Fed. Rep. of Germany

[73] Assignee: Telefunken Electronic GmbH, Heilbronn, Fed. Rep. of Germany

[21] Appl. No.: 629,619

[22] Filed: Jul. 11, 1984

[30] Foreign Application Priority Data

Jul. 27, 1983 [DE] Fed. Rep. of Germany ....... 3326957

[51] Int. Cl.[4] .............................................. H03F 3/195
[52] U.S. Cl. ........................................ 330/307; 357/51
[58] Field of Search ..................... 330/307; 357/14, 51

[56] References Cited

U.S. PATENT DOCUMENTS

| | | | |
|---|---|---|---|
| 3,544,862 | 12/1970 | Gallagher et al. | 357/51 X |
| 3,953,875 | 4/1976 | Cave et al. | 330/307 X |
| 4,409,608 | 10/1983 | Yoder | 357/14 X |

FOREIGN PATENT DOCUMENTS

| | | |
|---|---|---|
| 1944688 | 3/1971 | Fed. Rep. of Germany . |
| 1764148 | 5/1971 | Fed. Rep. of Germany . |
| 2607177 | 9/1976 | Fed. Rep. of Germany . |
| 1437435 | 7/1978 | Fed. Rep. of Germany . |
| 2927934 | 1/1981 | Fed. Rep. of Germany . |
| 3150058 | 8/1982 | Fed. Rep. of Germany . |
| 2834402 | 9/1982 | Fed. Rep. of Germany . |
| 2500057 | 12/1982 | Fed. Rep. of Germany . |

OTHER PUBLICATIONS

Towers, "Radio-And Intermediate-Frequency Amplifiers", *Wireless World,* vol. 77, No. 1426, Apr. 1971, pp. 191-194.

*Primary Examiner*—James B. Mullins
*Attorney, Agent, or Firm*—Spencer & Frank

[57] ABSTRACT

An integrated amplifier circuit comprising an amplifier transistor connected in a common base configuration with its base zone being connected via an integrated capacitance to the semiconductor substrate of the integrated circuit so as to connect (short circuit) the base zone to the semiconductor substrate at the operating frequency of the amplifier.

9 Claims, 4 Drawing Figures

HIGH FREQUENCY AMPLIFIER CIRCUIT

BACKGROUND OF THE INVENTION

As is known, there is often the danger of self-excitation of undesired oscillations in amplifier circuits comprising transistors with a high transit frequency. Undesired oscillations caused by the influence of unavoidable parasitic inductances and capacitances in cooperation with the amplifier transistor occur in a frequency range generally located substantially outside the operating frequency. The parasitic inductances can be traced back to the electrode leads and the parasitic capacitances tto capacitances located in the semiconductor body (e.g. barrier-layer capacitances) and also to external wiring capacitances. Both parasitic component types are also referred to as parasitic reactances. While the operating frequency in a VHF amplifier is, for example, 100 MHz, the undesired parasitic oscillations occur in the upper VHF or UHF range. The undesired oscillations result in reception interference and spurious radiation.

The undesired oscillations occur, particularly when the amplifier transistor is used in a grounded or common base circuit or configuration wherein, as is known, the base electrode, at the operating frequency, is short circuited to reference potential. In a common emitter circuit, however, the undesired oscillations are less frequent or easier to avoid. The problem of self-excitation of oscillations is particularly great in integrated circuits since the parasitic inductances are generally larger than in discrete designs. It is known to prevent the undesired parasitic oscillations by providing the leads with coverings of ferrite beads or by placing ferrite beads or resistors in the lead paths to the amplifier transistor. The known solutions do, however, have the disadvantage that the characteristics of the amplifier circuit are negatively, influenced in the operating frequency range, in particular, by an increase in the inherent noise of the amplifier circuit. The relatively high cost of known solutions is a further disadvantage. Since no satisfactory solution has yet been found to the aforementioned problems, pre-amplifiers are generally still made in accordance with the conventional technique.

SUMMARY OF THE INVENTION

The object of the invention is to provide an amplifier circuit which enables the manufacture of pre-amplifiers in the VHF range in accordance with the integrated technique using bipolar transistors with limit frequencies of several GHz and which prevents undesired oscillations in those integrated pre-amplifiers.

According to the invention there is provided an amplifier circuit comprising an amplifier transistor connected in a common base configuration. The circuit is integrated and the base zone of the amplifier transistor, at the operating frequency of the amplifier circuit is connected, i.e., short circuited, by an integrated capacitance to the semiconductor substrate of the integrated circuit. In this way, the detrimental effect of the parasitic base lead inductance is avoided.

The capacitance is of such dimensions as to be at least 20 times larger than the base-to-collector capacitance of the amplifier transistor. It is advantageous to use the invention in amplifier circuits operating in the VHF range (50–300 MHz).

The integrated capacitance is preferably in the form of a pn junction. To make the pn junction, a semiconductor zone preferably of a conductivity type opposite to that of the semiconductor area surrounding it is inserted into the semiconductor body. The semiconductor zone is inserted into the semiconductor body for formation of the pn junction by, for example, diffusion or by ion implantation.

BRIEF DESCRIPTION OF THE DRAWINGS

The invention will now be described in greater detail, by way of examples, with reference to the drawings, in which.

DESCRIPTION OF THE PREFERRED EMBODIMENTS

Figure 1:
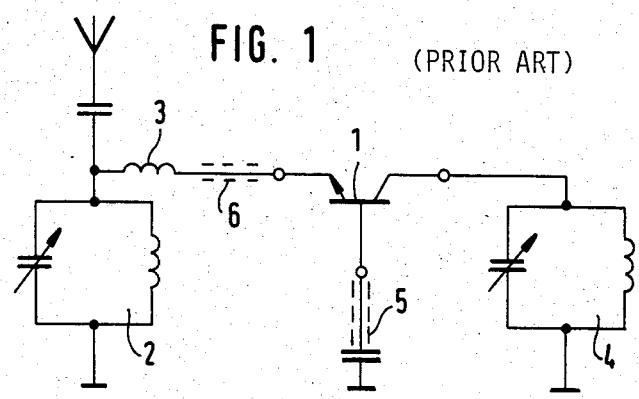
FIG. 1 shows the principal design of an amplifier circuit.

FIG. 1 shows the principal design of an amplifier circuit with a bipolar transistor 1 in a grounded or common base circuit, as used, for example, for VHF receivers. In the circuit shown in FIG. 1, the antenna signal is fed to a tuned input circuit 2 where it is preselected. The selected input signal reaches the emitter of the amplifier transistor 1 via the coupling inductance 3. The amplified output signal is fed to a further selection circuit 4 which further selects the signal. In order to avoid undesired oscillations, ferrite beads 5 and 6 are provided in the base and emitter leads in the known circuit of FIG. 1. These known measures do, however, have the aforementioned disadvantage of causing additional noise. In integrated circuits, the oscillation danger is even greater than in conventional circuits.

Figure 2:
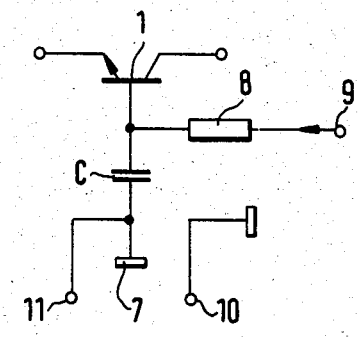
FIG. 2 shows an amplifier circuit according to the invention.

To enable the amplifier to be designed in accordance with the integrated technique, without the occurrence of parasitic oscillations and additional noise caused by external damping measures such as ferrite beads, there is provided in accordance with the invention, in FIG. 2, an integrated amplifier circuit, wherein the base zone of the amplifier transistor 1 for the operating frequency is connected by an integrated capacitance C to the semiconductor substrate (7) of the integrated circuit. The capacitance C which should, therefore, represent a short circuit at the operating frequency, if possible, should be at least 20 times larger than the base-to-collector capacitance of the amplifier transistor 1.

The operating potential is preferably fed internally to the base zone, for example, via the integrated resistor 8, in the embodiment shown. The base potential may, however, also be fed and altered externally via the connection 9. The connection 10 is a general substrate connection for other circuit components of the integrated circuit, while the substrate connection 11 is connected to a substrate area located in the immediate vicinity of the capacitance C. Since the connection 11 is directly connected to the capacitance area of the semiconductor substrate, it decreases the interfering influence of interference voltages located on the remaining substrate.

Figure 3:
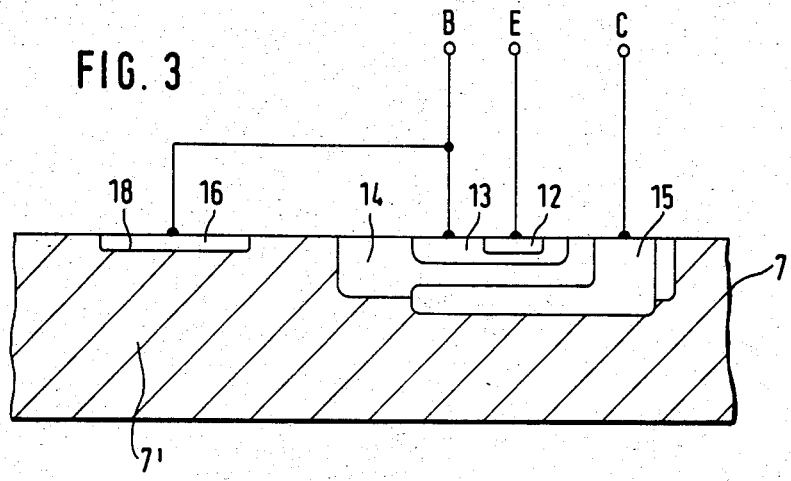
FIG. 3 shows an embodiment of the invention in accordance with the integrated technique.

FIG. 3 shows an embodiment of the invention in accordance with the integrated technique. Both the transistor and the capacitance are integrated in a common semiconductor substrate 7. The transistor consists of the emitter zone 12, the base zone 13 and the collector zone 14. The semiconductor zone 15 represents a low-resistance collector connection zone. Inserted in the semiconductor substrate beside the transistor is a semiconductor zone 16 forming with the substrate area 7' a pn junction 18 which acts as barrier-layer capacitance and produces the integrated capacitance C. The semiconductor zone 16, the emitter zone 12, the collector zone 14 and the semiconductor zone 15 are of a conductivity type opposite to that of the semiconductor substrate 7. Other circuit components may, of course, also be integrated in the integrated circuit of FIG. 3.

Figure 4:
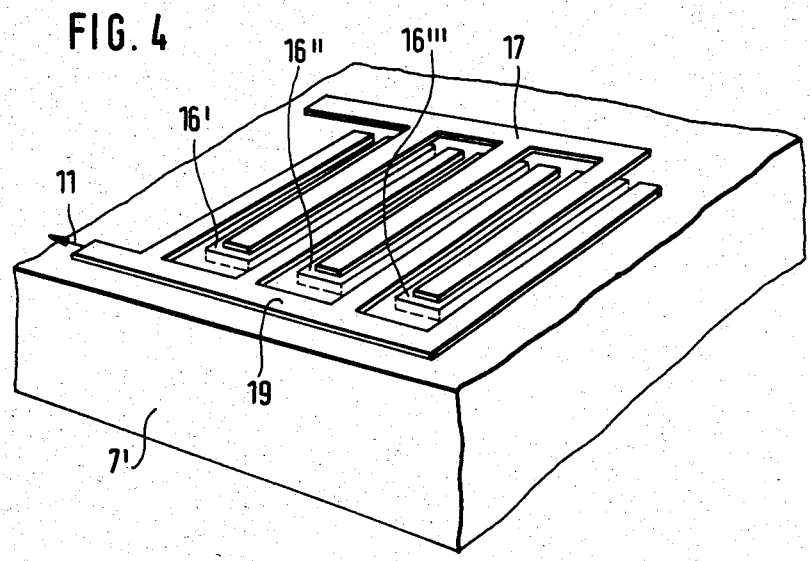
FIG. 4 shows an amplifier circuit wherein the capacitance comprises several strip-shaped semiconductor zones.

The arrangement shown in FIG. 4 differs from the arrangement of FIG. 3 in that the capacitance C is provided by means of several strip-shaped semiconductor zones 16', 16", 16''' which form respective pn junctions with the surrounding semiconductor substrate areas. In the embodiment of FIG. 4, the semiconductor zones 16', 16", 16''' are contacted by an electrode 17 of comb-type configuration. In addition to the comb-type electrode 17 there is also provided a further comb-type electrode 19 which contacts the semiconductor areas surrounding the semiconductor zones (16', 16", 16'''). The strip-shaped semiconductor zones may also be connected to one another by a semiconductor strip.

What is claimed is:

1. A high frequency amplifier circuit comprising: a passive tuned input circuit; a passive tuned output circuit; and a single amplifier transistor, for amplifying an input signal at a given operating frequency, integrated into a semiconductor substrate and connected in a common base configuration with its emitter zone directly connected to said input circuit to receive the input signal to be amplified, its collector zone connected to said output circuit, and its base zone connected to said semiconductor substrate via an integrated capacitance of a value which short circuits said base of said amplifying transistor to said substrate at the operating frequency of said amplifier circuit.

2. An amplifier circuit according to claim 1, wherein the capacitance is at least 20 times larger than the base-to-collector capacitance of the amplifier transistor.

3. An amplifier circuit according to claim 1, wherein the capacitance is designed such as to be of as high quality as possible.

4. An amplifier circuit according to claim 1, wherein the capacitance is in the form of a pn junction existing between a semiconductor zone inserted into the semiconductor substrate and the semiconductor area surrounding it.

5. An amplifier circuit according to claim 1, wherein the capacitance is in the form of several strip-shaped semiconductor zones inserted into the semiconductor substrate and forming pn junctions with the semiconductor areas surrounding them.

6. An amplifier circuit according to claim 5, wherein an electrode of comb-type configuration is provided for contacting the strip-shaped semiconductor zones.

7. An amplifier circuit according to claim 6, wherein an electrode of comb-type configuration is provided for contacting the semiconductor areas surrounding the strip-shaped semiconductor zones.

8. An amplifier circuit according to claim 5, wherein an electrode of comb-type configuration is provided for contacting the semiconductor areas surrounding the strip-shaped semiconductor zones.

9. An amplifier circuit according to claim 1, wherein the substrate includes a first substrate connection located in the immediate vicinity of, and connected to, the integrated capacitance, and a further general substrate connection intended for other circuit components of the integrated circuit.

* * * * *